United States Patent
Wu (10) Patent No.: US 10,141,892 B1
(45) Date of Patent: Nov. 27, 2018

(54) BIAS CIRCUIT FOR SUPPLYING A BIAS CURRENT TO A RF POWER AMPLIFIER

(71) Applicant: Rafael Microelectronics, Inc., Hsinchu County (TW)

(72) Inventor: Chih-Wen Wu, Taichung (TW)

(73) Assignee: RAFAEL MICROELECTRONICS, INC., Hsinchu (TW)

( * ) Notice: Subject to any disclaimer, the term of this patent is extended or adjusted under 35 U.S.C. 154(b) by 0 days.

(21) Appl. No.: 15/663,843

(22) Filed: Jul. 31, 2017

(51) Int. Cl.
| | |
|---|---|
| *H03K 3/04* | (2006.01) |
| *H03F 1/32* | (2006.01) |
| *H03F 3/189* | (2006.01) |
| *H03F 3/20* | (2006.01) |
| *H04M 1/02* | (2006.01) |

(52) U.S. Cl.
CPC ............... *H03F 1/32* (2013.01); *H03F 3/189* (2013.01); *H03F 3/20* (2013.01); *H03F 2200/451* (2013.01); *H04M 1/0202* (2013.01)

(58) Field of Classification Search
CPC .................................. H03F 1/302; H03F 3/04
USPC .................................................. 330/285, 296
See application file for complete search history.

(56) References Cited

U.S. PATENT DOCUMENTS

| | | | |
|---|---|---|---|
| 6,922,107 B1 * | 7/2005 | Green ................. | H03F 1/302 330/285 |
| 2009/0309663 A1 * | 12/2009 | Griffiths .............. | H03F 1/0272 330/296 |

* cited by examiner

*Primary Examiner* — Steven J Mottola
(74) *Attorney, Agent, or Firm* — Min-Lee Teng; Litron Patent & Trademark Office (57) ABSTRACT

A bias circuit for supplying a bias current to a RF power amplifier by using at least two voltage reference circuits coupled between the base terminal of a bipolar transistor and a voltage supply for generating a bias current to the RF power amplifier, wherein each of the at least two voltage reference circuits respectively clamps to a reference voltage at a corresponding terminal node of the voltage reference circuit on a conductive path having a current flowing from the voltage supply to the base terminal of the bipolar transistor, wherein when the current flowing out of the voltage supply increases, the current flowing through each of the at least two voltage reference circuits will also increases, so that the variation range of the bias current to the RF power amplifier will be kept in a smaller range compared with the variation range of the current flowing out of the power supply, thereby increasing the linearity of the RF power amplifier.

20 Claims, 7 Drawing Sheets

BIAS CIRCUIT FOR SUPPLYING A BIAS CURRENT TO A RF POWER AMPLIFIER

BACKGROUND OF THE INVENTION

1. Field of the Invention

The invention relates to RF power amplifier and, in particular, but not exclusively, to a bias circuit for supplying a bias current to a RF power amplifier.

2. Description of the Prior Art

A stable bias current supplied to a RF power amplifier is one of the most important factors for determining the performance of a RF power amplifier, especially for a RF power amplifier requires high-linearity. Nowadays, a wireless communication, such as WCDMA, LTE or WIFI, need a RF power amplifier with high-linearity. The RF power amplifier with high-linearity plays a very import role or even becomes a must in the future mobile communication, especially the fifth generation mobile communication.

A voltage supply of a RF power amplifier circuit in a mobile device is provided by a battery. However, as the power provided by the battery varies from time to time, the bias current supplied to the RF power amplifier will also varies in a large range and hence degrade the performance of the RF power amplifier. Therefore, how to reduce the variation range of the bias current supplied to the RF power amplifier as the power provided by the battery varies in a larger range becomes a very important topic when designing a RF power amplifier, especially when the RF power amplifier will be manufactured by using GaAs heterojunction-bipolar-transistor (HBT) process.

SUMMARY OF THE INVENTION

The present invention discloses a bias circuit for supplying a bias current to a RF power amplifier by using multiple voltage reference circuits coupled between the base terminal of a bipolar transistor and a voltage supply for generating a bias current to the RF power amplifier, wherein each of the multiple voltage reference circuits respectively clamps to a reference voltage at a node coupled to a conductive path having a current flowing from the voltage supply to the base terminal of the bipolar transistor, wherein when the current flowing out of the voltage supply increases, the current flowing through each of the multiple voltage reference circuits will also increases so that the variation range of the current flowing into the base terminal of the bipolar transistor will be kept in a smaller range compared with the variation range of the current flowing out of the power supply, thereby increasing the linearity of the RF power amplifier.

The present invention discloses a bias circuit for supplying a bias current to a RF power amplifier, said bias circuit comprising: a first bipolar transistor having a base terminal, a collector terminal and an emitter terminal, wherein the emitter terminal is electrically coupled to the RF power amplifier; a first voltage reference circuit for clamping a first terminal of the first voltage reference circuit at a first reference voltage, wherein the first terminal of the first voltage reference circuit is electrically coupled to the base terminal of the first bipolar transistor through a first resistive component, and a second terminal of the first voltage reference circuit is electrically coupled to a ground; and a second voltage reference circuit for clamping a first terminal of the second voltage reference circuit at a second reference voltage, wherein the first terminal of the second voltage reference circuit is electrically coupled to the first terminal of the first voltage reference circuit through a second resistive component, and a second terminal of the second voltage reference circuit is electrically coupled to the ground; wherein the first terminal of the second voltage reference circuit is electrically coupled to a voltage supply through a third resistive component so as to generate a bias current to the RF power amplifier through the emitter terminal of the first bipolar transistor.

In one embodiment, said voltage supply is provided by a battery.

In one embodiment, said bias circuit, the RF power amplifier and the battery are used in a mobile device such as a mobile phone.

In one embodiment, said bias circuit further comprising a third voltage reference circuit for clamping a first terminal of third voltage reference circuit at a third reference voltage, wherein the first terminal of the third voltage reference circuit is electrically coupled to first terminal of the second voltage reference circuit transistor through a fourth resistive component, and a second terminal of the third voltage reference circuit is electrically coupled to the ground.

In one embodiment, the first bipolar transistor is a bipolar NPN transistor.

In one embodiment, the bipolar NPN transistor is made by GaAs heterojunction-bipolar-transistor (HBT) process.

In one embodiment, wherein the RF power amplifier is used for amplifying a RF signal based on WCDMA, LTE or WIFI standard.

In one embodiment, said bias circuit and the RF power amplifier are used in a mobile phone.

In one embodiment, wherein said first voltage reference circuit comprises a second bipolar NPN transistor and a third bipolar NPN transistor and a fourth resistive component, wherein the base terminal of the second bipolar NPN transistor is electrically coupled to the collector terminal of the second NPN bipolar, the base terminal of the third bipolar NPN transistor is electrically coupled to the collector terminal of the third NPN bipolar, wherein the emitter terminal of the second bipolar NPN transistor is electrically coupled to the collector terminal of the third NPN bipolar, and the emitter terminal of the third bipolar NPN transistor is electrically coupled to ground through the fourth resistive component.

In one embodiment, wherein said second voltage reference circuit comprises a fourth bipolar NPN transistor and a fifth bipolar NPN transistor and a sixth resistive component, wherein the base terminal of the fourth bipolar NPN transistor is electrically coupled to the collector terminal of the fourth NPN bipolar, the base terminal of the fifth bipolar NPN transistor is electrically coupled to the collector terminal of the fifth NPN bipolar, wherein the emitter terminal of the fourth bipolar NPN transistor is electrically coupled to the collector terminal of the fifth NPN bipolar, and the emitter terminal of the fifth bipolar NPN transistor is electrically coupled to ground through the fifth resistive component.

In one embodiment, said bias circuit further comprising a third voltage reference circuit for clamping a first terminal of third voltage reference circuit at a third reference voltage, wherein the first terminal of the third voltage reference circuit is electrically coupled to first terminal of the second voltage reference circuit transistor through a seventh resistive component, wherein said third voltage reference circuit comprises a sixth bipolar NPN transistor and a seventh bipolar NPN transistor and a resistor, wherein the base terminal of the sixth bipolar NPN transistor is electrically coupled to the collector terminal of the sixth NPN bipolar, the base terminal of the seventh bipolar NPN transistor is electrically coupled to the collector terminal of the seventh NPN bipolar, wherein the emitter terminal of the sixth bipolar NPN transistor is electrically coupled to the collector terminal of the seventh NPN bipolar, and the emitter terminal of the seventh bipolar NPN transistor is electrically coupled to the ground through an eighth resistive component.

The present invention also discloses a circuit for amplifying a RF signal received in a mobile device, said circuit comprising: a RF power amplifier; a first bipolar transistor having a base terminal, a collector terminal and an emitter terminal, wherein the emitter terminal is electrically coupled to the RF power amplifier; a first voltage reference circuit for clamping a first terminal of the first voltage reference circuit at a first reference voltage, wherein the first terminal of the first voltage reference circuit is electrically coupled to the base terminal of the first bipolar transistor through a first resistive component, and a second terminal of the first voltage reference circuit is electrically coupled to a ground; and a second voltage reference circuit for clamping a first terminal of the second voltage reference circuit at a second reference voltage, wherein the first terminal of the second voltage reference circuit is electrically coupled to the first terminal of the first voltage reference circuit transistor through a second resistive component, and a second terminal of the second voltage reference circuit is electrically coupled to the ground; wherein a first terminal of the second voltage reference circuit is electrically coupled to a voltage supply through a third resistive component so as to generate a bias current to the RF power amplifier through the emitter terminal of the first bipolar transistor.

The detailed technology and above preferred embodiments implemented for the present invention are described in the following paragraphs accompanying the appended drawings for people skilled in this field to well appreciate the features of the claimed invention.

BRIEF DESCRIPTION OF DRAWINGS

The foregoing aspects and many of the accompanying advantages of this invention will become more readily appreciated as the same becomes better understood by reference to the following detailed description when taken in conjunction with the accompanying drawings, wherein.

DETAILED DESCRIPTION OF EMBODIMENT

The detailed explanation of the present invention is described as following. The described preferred embodiments are presented for purposes of illustrations and description, and they are not intended to limit the scope of the present invention.

Figure 1:
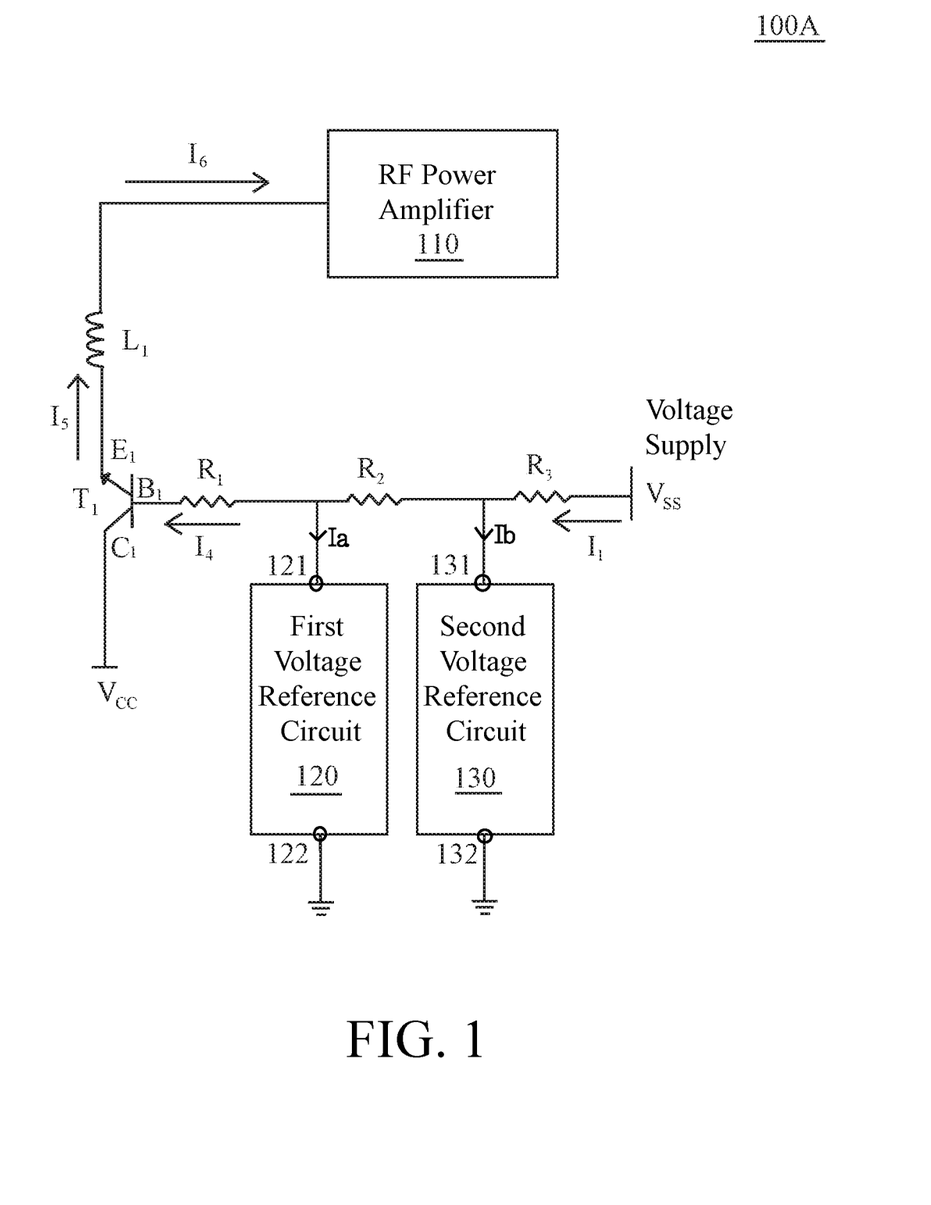
FIG. 1 illustrates a bias circuit for supplying a bias current to a RF power amplifier in accordance with one embodiment of the present invention.

FIG. 1 illustrates a bias circuit 100A for supplying a bias current I6 to a RF power amplifier 110 in accordance with one embodiment of the present invention. The bias circuit 100A comprises a first bipolar transistor T1 (e.g., GaAs bipolar transistor), a first voltage reference circuit 120 and a second voltage reference circuit 130. The first bipolar transistor T1 has a base terminal B1, a collector terminal C1 and an emitter terminal E1. The emitter terminal E1 of the first bipolar transistor T1 is electrically coupled to the RF power amplifier 110 (e.g., through an inductive component L1) for supplying a bias current I6 to the RF power amplifier 110. A voltage supply Vcc is electrically coupled to the collector terminal C1 of the first bipolar transistor T1. The voltage supply Vss is electrically coupled to the second voltage reference circuit 130 so as to generate the bias current I6 through the emitter terminal E1 of the first bipolar transistor T1. The first terminal 121 of the first voltage reference circuit 120 is electrically coupled to the base terminal B1 of the first bipolar transistor T1 through the first resistive component R1, and the second terminal 122 of the first voltage reference circuit 120 is electrically coupled to ground. The first voltage reference circuit 120 clamps the first terminal 121 of the first voltage reference circuit 120 at a first reference voltage. The first terminal 131 of the second voltage reference circuit 130 is electrically coupled to the first terminal 121 of the first voltage reference circuit 120 through the second resistive component R2, and the second terminal 132 of the second voltage reference circuit 130 is electrically coupled to ground. The second voltage reference circuit 130 clamps the first terminal 131 of the second voltage reference circuit 130 at a second reference voltage. The first terminal 131 of the second voltage reference circuit 130 is electrically coupled to the voltage supply Vss through the third resistive component R3 so as to generate a bias current I6 to the RF power amplifier 110 through the current I5 flowing out of the emitter terminal E1 of the first bipolar transistor T1.

As shown in FIG. 1, the first bipolar transistor T1 is a bipolar NPN transistor; however, a bipolar PNP transistor can be used based on design consideration and the circuit in FIG. 1 can be adjusted for operating with the bipolar PNP transistor. The bipolar NPN transistor can be made by GaAs heterojunction-bipolar-transistor (HBT) process. The RF power amplifier 110 can be used for amplifying a RF signal based on WCDMA, LTE or WIFI standard.

As shown in FIG. 1, each of the first voltage reference circuit 120 and the second voltage reference circuit 130 respectively clamps a reference voltage at its terminal node, 121, 131, on the conductive path from the voltage supply Vss to the base terminal B1 of the first bipolar transistor T1, wherein when the current I1 flowing out of the voltage supply Vss increases, the current Ia flowing into the voltage reference circuit 120 and the current Ib flowing into the voltage reference circuit 130 will also increase so that the variation range of the current I4 of the base terminal B1 of the bipolar transistor T1 will be kept in a smaller range compared with the variation range of the current I1 flowing out of the power supply Vss, thereby increasing the linearity of the current I4 flowing into the base terminal B1 of the bipolar transistor T1, which will increase the linearity of current I5 flowing out of the emitter terminal E1 of the first bipolar transistor T1 so that the linearity of the bias current I6 to the RF power amplifier 110 is also increased for increasing the linearity of the RF power amplifier 110.

In one embodiment, the voltage supply Vss can be provided by a battery. The circuit 100A with a battery to provide voltage supply Vss can be used in a mobile device such as a mobile phone, a pad or a notebook.

In one embodiment, the bipolar NPN transistor can be made by GaAs heterojunction-bipolar-transistor (HBT) process. The RF power amplifier 110 can be used for amplifying a RF signal based on WCDMA, LTE or WIFI standard.

Figure 2A:
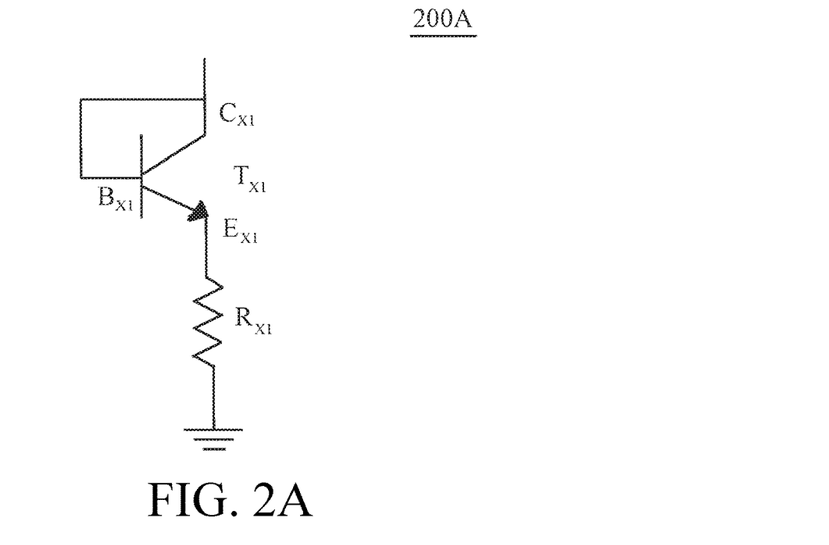
FIG. 2A illustrates an exemplary circuit of a voltage reference circuit in FIG. 1.

FIG. 2A illustrates an exemplary circuit of a voltage reference circuit 200A for implementing each of the first voltage reference circuit 120 and the second voltage reference circuit 130 in FIG. 1. The exemplary circuit of the voltage reference circuit 200A can be applied to each of the first voltage reference circuit 120 and the second voltage reference circuit 130 in FIG. 1. However, the present invention is not limited to the actual implementations of the first voltage reference circuit 120 and the second voltage reference circuit 130, and the first voltage reference circuit 120 and the second voltage reference circuit 130 can be the same or different from each other based on design considerations.

As shown in FIG. 2A, the voltage reference circuit 200A comprises a transistor TX1 and a resistive component RX1. Please note that resistive component in present invention can be implemented in many forms, for example, the resistive component can be implemented by a single resistor or by using multiple resistors to form an equivalent resistance, or the resistive component can be implemented by any suitable device having resistance therein. As shown in FIG. 2A, the transistor TX1 is a bipolar NPN transistor, but it can be a bipolar PNP transistor based on some other design considerations; the base terminal BX1 of the bipolar NPN transistor TX1 is electrically coupled to the collector terminal CX1 of the bipolar NPN transistor TX1, and the emitter terminal EX1 of the bipolar NPN transistor TX1 is electrically coupled to ground through the resistive component RX1. The collector terminal CX1 of the bipolar NPN transistor TX1 is coupled to a conductive path to conductive a current path following from the voltage supply Vss to the base terminal B1 of the first bipolar transistor T1.

As shown in FIG. 2A, base terminal BX1 is electrically connected to the collector terminal CX1 of the bipolar NPN transistor TX1, the voltage difference between the collector terminal CX1 and the emitter terminal EX1 of the bipolar NPN transistor TX1 is equal to the voltage difference between the base terminal BX1 and the emitter terminal EX1 of the bipolar NPN transistor TX1. Since the voltage difference between the base terminal BX1 and the emitter terminal EX1 of the bipolar NPN transistor TX1 is about 1.2-1.3V, and therefore the voltage difference between the collector terminal CX1 and the emitter terminal EX1 of the bipolar NPN transistor is about 1.2-1.3V. Please note that said 1.2-1.3V is assumed when the bipolar NPN transistor TX1 is made by GaAs heterojunction-bipolar-transistor (HBT) process. Accordingly, the voltage at the collector terminal of the bipolar NPN transistor TX1 is clamped at a voltage that is equal to 1.2-1.3V plus the voltage drop generated by a current flowing through the resistive component RX1.

Figure 3A:
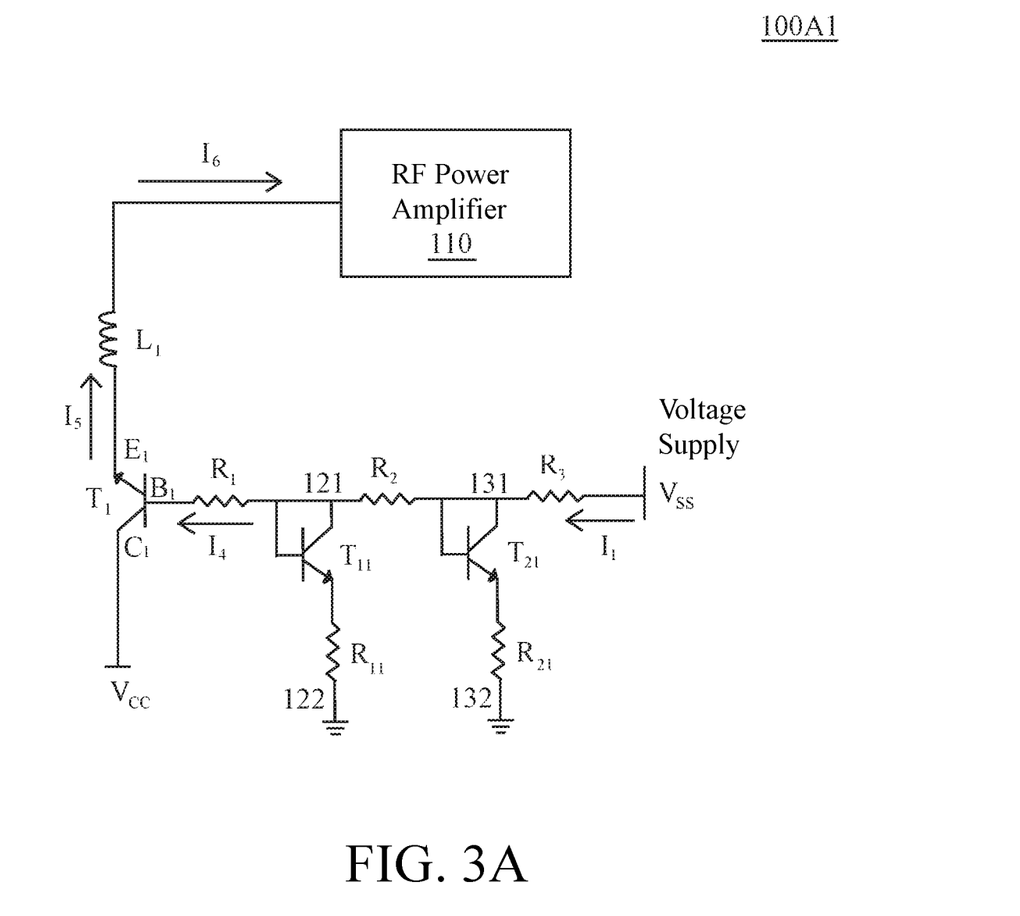
FIG. 3A illustrates a bias circuit for supplying a bias current to a RF power amplifier in which the exemplary circuit of the voltage reference circuit in FIG. 2A is applied to each of the first voltage reference circuit and the second voltage reference circuit of FIG. 1.

FIG. 3A illustrates a bias circuit 100A1 for supplying a bias current I6 to a RF power amplifier 110 in which the exemplary circuit of the voltage reference circuit 200A in FIG. 2A is applied to each of the first voltage reference circuit 120 and the second voltage reference circuit 130 of FIG. 1, wherein when the current I1 flowing out of the voltage supply Vss increases, the current flowing through each of the voltage reference circuits 200A will also increase so that the current I4 variation of the base terminal B1 of the bipolar transistor T1 will be kept in a smaller range compared with the current I1 variation range of the power supply Vss, thereby increasing the linearity of the current I4 flowing into the base terminal B1 of the bipolar transistor T1, and hence increasing the linearity of current I5 flowing out of the emitter terminal E1 of the first bipolar transistor T1 so as to increase the linearity of the RF power amplifier 110.

Figure 2B:
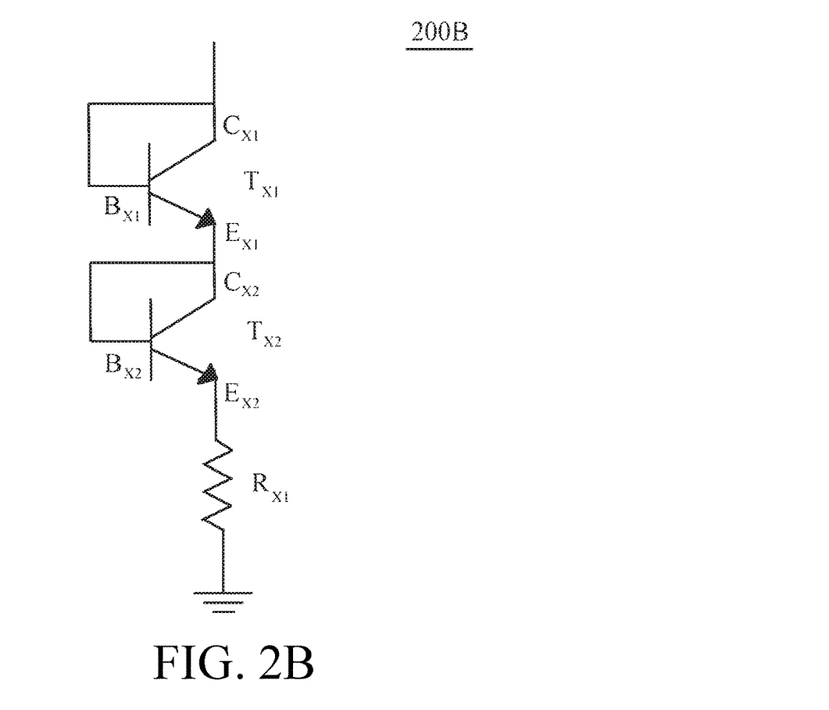
FIG. 2B illustrates another exemplary circuit of a voltage reference circuit in FIG. 1.

FIG. 2B illustrates an exemplary circuit of the voltage reference circuit 200B. The exemplary circuit of the voltage reference circuit 200B can be applied to each of the first voltage reference circuit 120 and the second voltage reference circuit 130 of FIG. 1. However, the present invention is not limited to this case, the first voltage reference circuit 120 and the second voltage reference circuit 130 can be the same or different from each other.

As shown in FIG. 2B, the voltage reference circuit 200B comprises a bipolar NPN transistor TX1, a bipolar NPN transistor TX2 and a resistive component RX1. Please note that resistive component can be implemented in many forms, for example, the resistive component can be implemented by a single resistor or by using multiple resistors to form an equivalent resistance, or the resistive component can be implemented by any suitable device having resistance therein. In this example, each of the transistor TX1 and transistor TX2 is a bipolar NPN transistor, but each of the transistor TX1 and transistor TX2 can be a bipolar PNP transistor based on some other design considerations. The base terminal BX1 of the bipolar NPN transistor TX1 is electrically connected to the collector terminal CX1 of the bipolar NPN transistor TX1, and the base terminal BX2 of the bipolar NPN transistor TX2 is electrically coupled to the collector terminal CX2 of the bipolar NPN transistor TX2, wherein the emitter terminal EX1 of the bipolar NPN transistor TX1 is electrically coupled to the collector terminal CX2 of the bipolar NPN transistor TX2, and the emitter terminal EX2 of the bipolar NPN transistor TX2 is electrically coupled to ground through the resistive component RX1. The collector terminal CX1 of the bipolar NPN transistor TX1 is coupled to a conductive path having a current following from the voltage supply Vss to the base terminal B1 of the first bipolar transistor.

As shown in FIG. 2B, the voltage difference between the collector terminal CX1 and the emitter terminal EX1 of the bipolar NPN transistor TX1 is equal to the voltage difference between the base terminal BX1 and emitter terminal EX1 of the bipolar NPN transistor TX1, that is, the voltage difference between the collector terminal CX1 and the emitter terminal EX1 of the bipolar NPN transistor TX1 is about 1.2-1.3V when the bipolar NPN transistor TX1 is made by GaAs heterojunction-bipolar-transistor (HBT) process; and the voltage difference between the collector terminal CX2 and the emitter terminal EX2 of the bipolar NPN transistor TX2 is equal to the voltage difference between the base terminal BX2 and emitter terminal EX2 of the bipolar NPN transistor TX1, that is, the voltage difference between the collector terminal CX2 and the emitter terminal EX2 of the bipolar NPN transistor TX2 is about 1.2-1.3V when the bipolar NPN transistor TX2 is made by GaAs heterojunction-bipolar-transistor (HBT) process, wherein the voltage at the collector terminal CX1 of the bipolar NPN transistor TX1 is clamped at a voltage that is equal to 2.4-2.6V plus the voltage drop generated by a current flowing through the resistive component RX1.

Figure 3B:
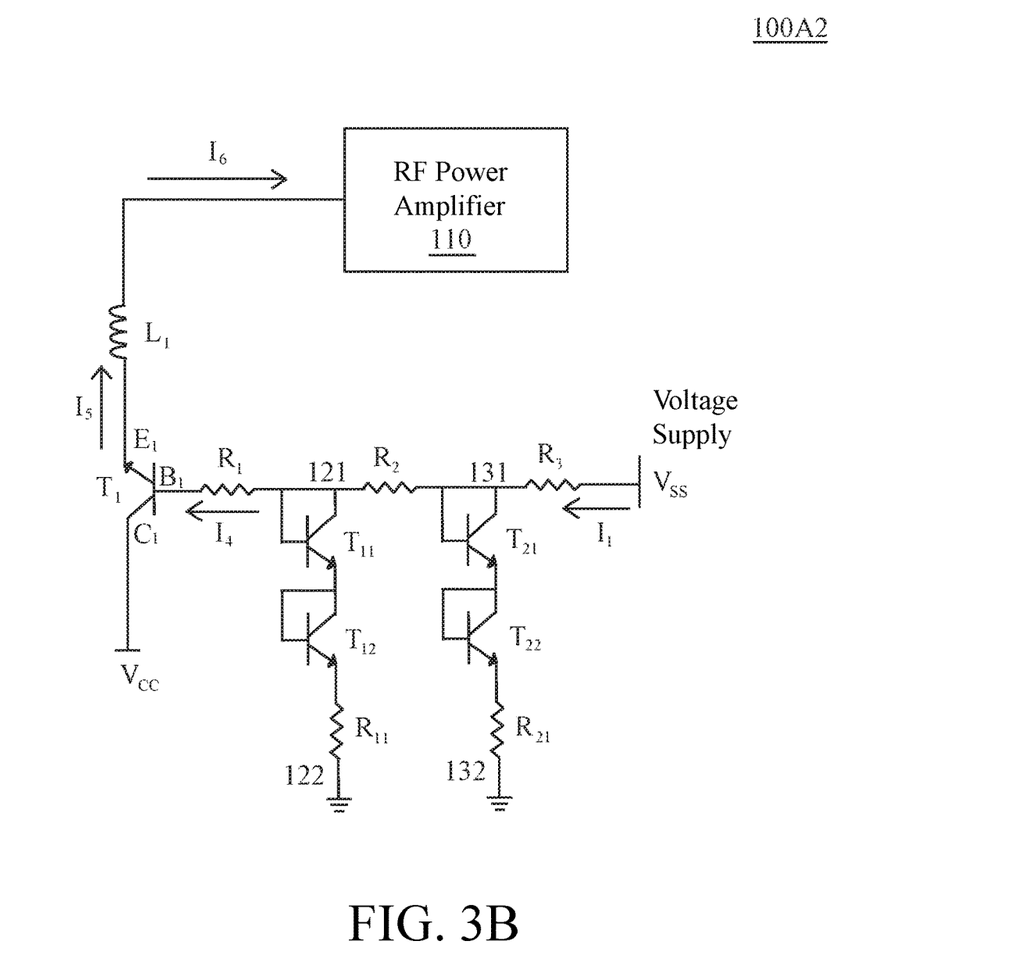
FIG. 3B illustrates a bias circuit for supplying a bias current to a RF power amplifier in which the exemplary circuit of the voltage reference circuit in FIG. 2B is applied to each of the first voltage reference circuit and the second voltage reference circuit of FIG. 1.

FIG. 3B illustrates a bias circuit 100A2 for supplying a bias current I6 to a RF power amplifier 110 in which the exemplary circuit of the voltage reference circuit 200B in FIG. 2B is applied to each of the first voltage reference circuit 120 and the second voltage reference circuit 130 in FIG. 1, wherein when the current I1 flowing out of the voltage supply Vss increases, the current flowing through each of the voltage reference circuits 200B will also increase so that the current I4 variation of the base terminal B1 of the bipolar transistor T1 will be kept in a smaller range compared with the current I1 variation range of the power supply Vss, thereby increasing the linearity of the current I4 flowing into the base terminal B1 of the bipolar transistor T1, and hence increasing the linearity of current I5 flowing out of the emitter terminal E1 of the first bipolar transistor T1 so as to increase the linearity of the RF power amplifier 110.

Figure 4:
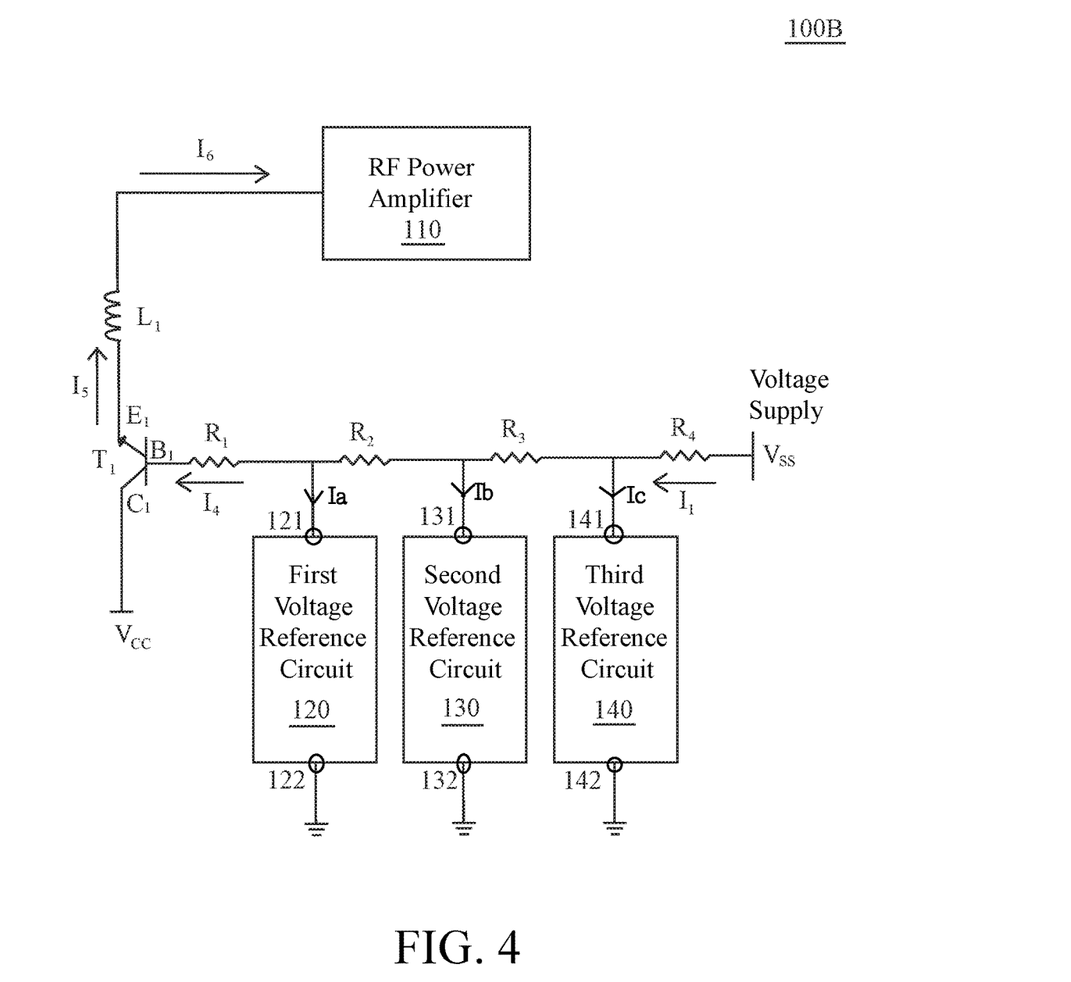
FIG. 4 illustrates the bias circuit further comprises a third voltage reference circuit between the second voltage reference circuit and the voltage supply Vss compared with FIG. 1.

In another embodiment of the present invention, three voltage reference circuits instead of two voltage reference circuits are used for increasing the linearity of current I5 flowing out of the emitter terminal E1 of the first bipolar transistor T1 so as to increase the linearity of the RF power amplifier 110 of FIG. 1. As shown in FIG. 4, the bias circuit 100B further comprises a third voltage reference circuit 140 between the second voltage reference circuit 130 and the voltage supply Vss. The first terminal 141 of the third voltage reference circuit 140 is electrically coupled to first terminal 131 of the second voltage reference circuit 130 through a resistive component R3 and electrically coupled to the voltage supply Vss through the resistive component R4. The second terminal 142 of the third voltage reference circuit 140 is electrically coupled to ground. The third voltage reference circuit 140 clamps the first terminal 141 at a third reference voltage.

As shown in FIG. 4, the first bipolar transistor T1 is a bipolar NPN transistor; however, a bipolar PNP transistor can be used as well when needed, wherein when the current I1 flowing out of the voltage supply Vss increases, wherein when the current I1 flowing out of the voltage supply Vss increases, the current Ia flowing into the voltage reference circuit 120, the current Ib flowing into the voltage reference circuit 130 and the current Ic flowing into the voltage reference circuit 140 will also increase so that the current I4 variation of the base terminal B1 of the bipolar transistor T1 will be kept in a smaller range compared with the current I1 variation range of the power supply Vss, thereby increasing the linearity of the current I4 flowing into the base terminal B1 of the bipolar transistor T1, and hence increasing the linearity of current I5 flowing out of the emitter terminal E1 of the first bipolar transistor T1 so as to increase the linearity of the RF power amplifier 110.

Figure 5A:
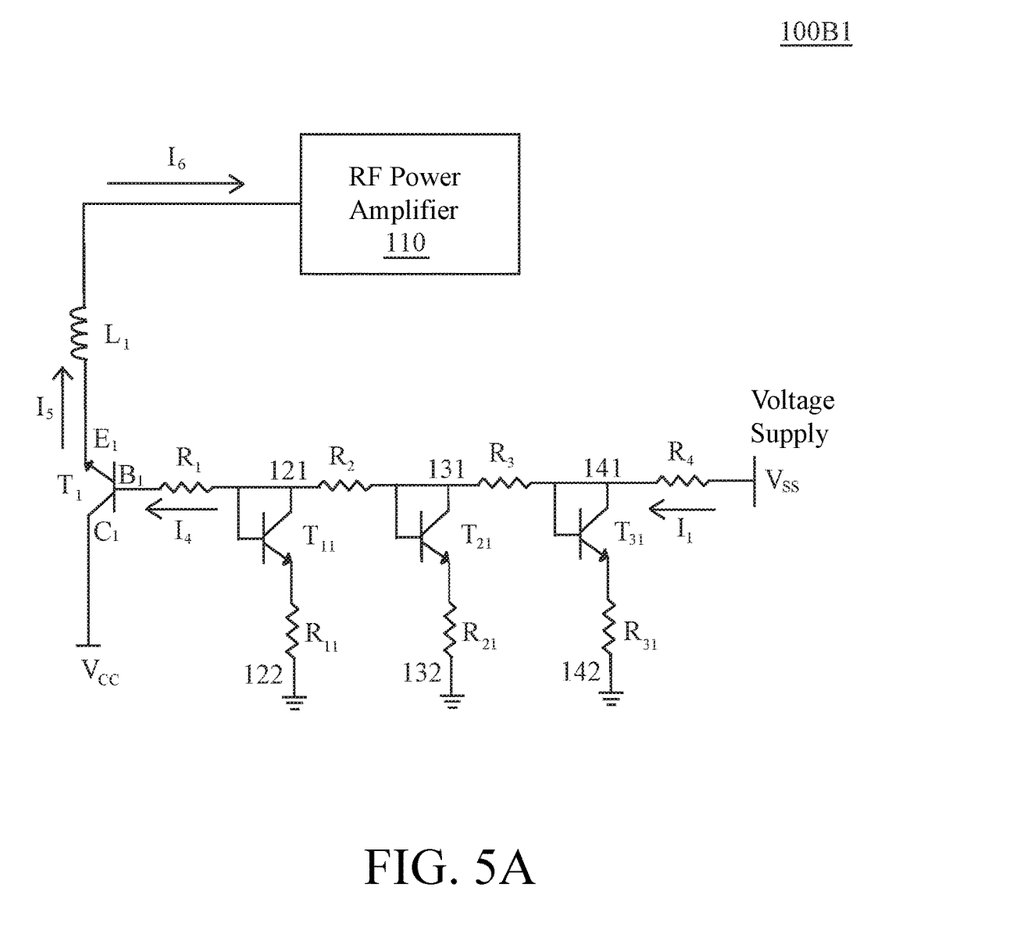
FIG. 5A illustrates a bias circuit for supplying a bias current to a RF power amplifier in which the exemplary circuit of the voltage reference circuit in FIG. 2A is applied to each of the first voltage reference circuit, the second voltage reference circuit and the third voltage reference circuit of FIG. 4.

FIG. 5A illustrates a bias circuit 100B1 for supplying a bias current I6 to a RF power amplifier 110 in which the exemplary circuit of the voltage reference circuit 200A in FIG. 2A is applied to each of the first voltage reference circuit 120, the second voltage reference circuit 130 and the third voltage reference circuit 140 of FIG. 4, wherein when the current I1 flowing out of the voltage supply Vss increases, the current flowing through each of the voltage reference circuits 200A will also increase so that the current I4 variation of the base terminal B1 of the bipolar transistor T1 will be kept in a smaller range compared with the current I1 variation range of the power supply Vss, thereby increasing the linearity of the current I4 flowing into the base terminal B1 of the bipolar transistor T1, and hence increasing the linearity of current I5 flowing out of the emitter terminal E1 of the first bipolar transistor T1 so as to increase the linearity of the RF power amplifier 110.

Figure 5B:
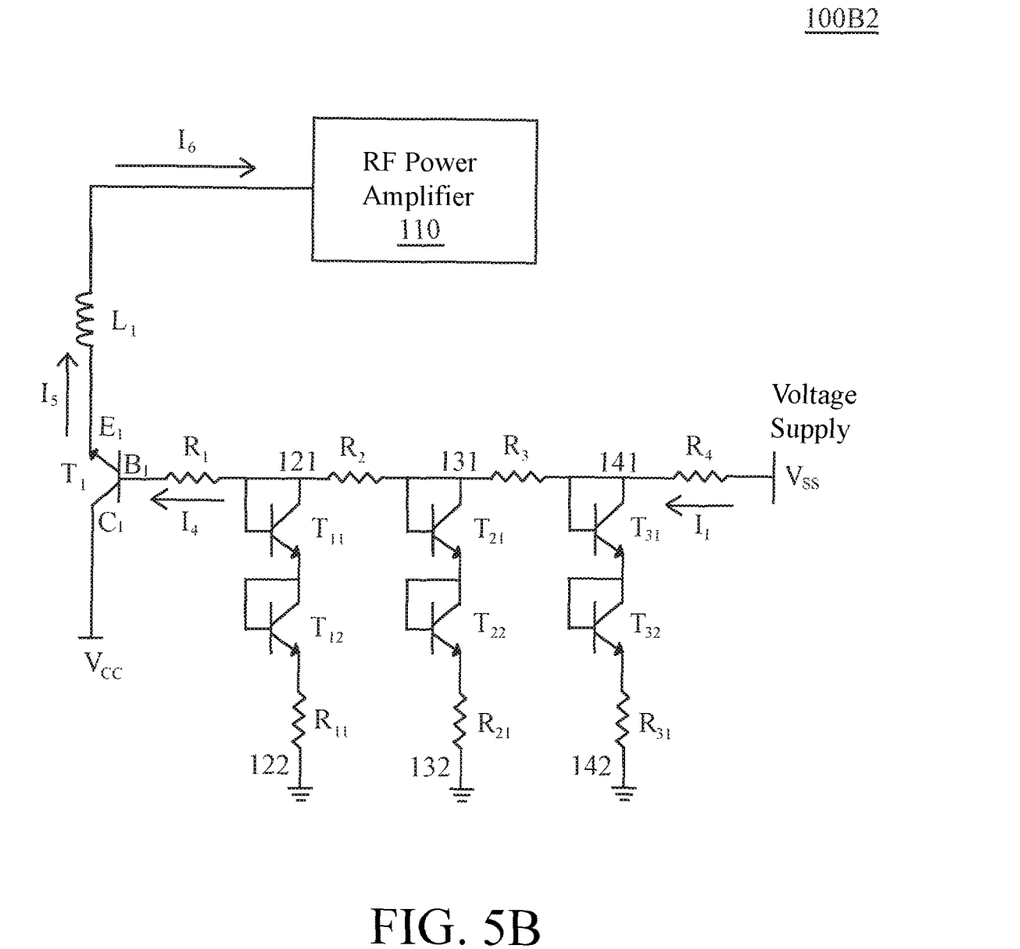
FIG. 5B illustrates a bias circuit for supplying a bias current to a RF power amplifier in which the exemplary circuit of the voltage reference circuit in FIG. 2B is applied to each of the first voltage reference circuit, the second voltage reference circuit and the third voltage reference circuit of FIG. 4.

FIG. 5B illustrates a bias circuit 100B2 for supplying a bias current I6 to a RF power amplifier 110 in which the exemplary circuit of the voltage reference circuit 200B in FIG. 2B is applied to each of the first voltage reference circuit 120, the second voltage reference circuit 130 and the third voltage reference circuit 140 of FIG. 4, wherein when the current I1 flowing out of the voltage supply Vss increases, the current flowing through each of the voltage reference circuits 200B will also increase so that the current I4 variation of the base terminal B1 of the bipolar transistor T1 will be kept in a smaller range compared with the current I1 variation range of the power supply Vss, thereby increasing the linearity of the current I4 flowing into the base terminal B1 of the bipolar transistor T1, and hence increasing the linearity of current I5 flowing out of the emitter terminal E1 of the first bipolar transistor T1 so as to increase the linearity of the RF power amplifier 110.

The foregoing descriptions of specific embodiments of the present invention have been presented for purposes of illustrations and description. They are not intended to be exclusive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to particular use contemplated. It is intended that the scope of the invention be defined by the claims appended hereto and their equivalents.

What is claimed is:

1. A bias circuit for supplying a bias current to an RF power amplifier, said bias circuit comprising:
    a first bipolar transistor having a base terminal, a collector terminal and an emitter terminal, wherein the emitter terminal is electrically coupled to the RF power amplifier;
    a first voltage reference circuit for clamping a first terminal of first voltage reference circuit at a first reference voltage, wherein the first terminal of the first voltage reference circuit is electrically coupled to base terminal of the first bipolar transistor through a first resistive component, and a second terminal of the first voltage reference circuit is electrically coupled to a ground; and
    a second voltage reference circuit for clamping a first terminal of second voltage reference circuit at a second reference voltage, wherein the first terminal of the second voltage reference circuit is electrically coupled to the first terminal of the first voltage reference circuit transistor through a second resistive component, and a second terminal of the second voltage reference circuit is electrically coupled to the ground;

wherein a first terminal of the second voltage reference circuit is electrically coupled to a voltage supply through a third resistive component so as to generate a bias current to the RF power amplifier through the emitter terminal of the first bipolar transistor;

wherein the first resistive component, the second resistive component and the third resistive component are connected in series one by one in a conductive path connecting the base terminal of the first bipolar transistor to the voltage supply, wherein the second resistive component is located between the first resistive component and the third resistive component in said conductive path.

2. The bias circuit for supplying a bias current to an RF power amplifier of claim 1, said voltage supply is provided by a battery.

3. The bias circuit for supplying a bias current to an RF power amplifier of claim 2, said bias circuit, the RF power amplifier and the battery are used in a mobile phone.

4. The bias circuit for supplying a bias current to an RF power amplifier of claim 1, wherein the first bipolar transistor is a bipolar NPN transistor.

5. The bias circuit for supplying a bias current to an RF power amplifier of claim 4, where the bipolar NPN transistor is made by GaAs heterojunction-bipolar-transistor (HBT) process.

6. The bias circuit for supplying a bias current to an RF power amplifier of claim 5, wherein the RF power amplifier is used for amplifying an RF signal based on WCDMA, LTE or WIFI standard.

7. The bias circuit for supplying a bias current to an RF power amplifier of claim 6, said bias circuit and the RF power amplifier are used in a mobile phone.

8. A circuit for amplifying an RF signal received in a mobile device, said circuit comprising:
an RF power amplifier;
a first bipolar transistor having a base terminal, a collector terminal and an emitter terminal wherein the emitter terminal is electrically coupled to the RF power amplifier;
a first voltage reference circuit for clamping a first terminal of first voltage reference circuit at a first reference voltage, wherein the first terminal of the first voltage reference circuit is electrically coupled to base terminal of the first bipolar transistor through a first resistive component, and a second terminal of the first voltage reference circuit is electrically coupled to a ground; and
a second voltage reference circuit for clamping a first terminal of second voltage reference circuit at a second reference voltage, wherein the first terminal of the second voltage reference circuit is electrically coupled to the first terminal of the first voltage reference circuit transistor through a second resistive component, and a second terminal of the second voltage reference circuit is electrically coupled to the ground;
wherein a first terminal of the second voltage reference circuit is electrically coupled to a voltage supply through a third resistive component so as to generate a bias current to the RF power amplifier through the emitter terminal of the first bipolar transistor;
wherein the first resistive component, the second resistive component and the third resistive component are connected in series one by one in a conductive path connecting the base terminal of the first bipolar transistor to the voltage supply, wherein the second resistive component is located between the first resistive component and the third resistive component in said conductive path.

9. The circuit for amplifying an RF signal received in a mobile device of claim 8, further comprising a third voltage reference circuit for clamping a first terminal of third voltage reference circuit at a third reference voltage, wherein the first terminal of the third voltage reference circuit is electrically coupled to first terminal of the second voltage reference circuit transistor through a third resistive component, and a second terminal of the third voltage reference circuit is electrically coupled to the ground.

10. The circuit for amplifying an RF signal received in a mobile device of claim 8, said voltage supply is provided by a battery.

11. The circuit for amplifying an RF signal received in a mobile device of claim 10, said circuit for amplifying an RF signal and the battery are used in a mobile phone.

12. The circuit for amplifying an RF signal received in a mobile device of claim 11, where the bipolar NPN transistor is made by GaAs heterojunction-bipolar-transistor (HBT) process.

13. The circuit for amplifying an RF signal received in a mobile device of claim 12, wherein the RF power amplifier is used for amplifying an RF signal based on WCDMA, LTE or WIFI standard.

14. The circuit for amplifying an RF signal received in a mobile device of claim 8, wherein said first voltage reference circuit comprises a second bipolar NPN transistor and a third bipolar NPN transistor and a fourth resistive component, wherein the base terminal of the second bipolar NPN transistor is electrically coupled to the collector terminal of the second NPN bipolar, the base terminal of the third bipolar NPN transistor is electrically coupled to the collector terminal of the third NPN bipolar, wherein the emitter terminal of the second bipolar NPN transistor is electrically coupled to the collector terminal of the third NPN bipolar, and the emitter terminal of the third bipolar NPN transistor is electrically coupled to ground through the fourth resistive component.

15. The circuit for amplifying an RF signal received in a mobile device of claim 14, wherein said second voltage reference circuit comprises a fourth bipolar NPN transistor and a fifth bipolar NPN transistor and a fifth resistive component, wherein the base terminal of the fourth bipolar NPN transistor is electrically coupled to the collector terminal of the fourth NPN bipolar, the base terminal of the fifth bipolar NPN transistor is electrically coupled to the collector terminal of the fifth NPN bipolar, wherein the emitter terminal of the fourth bipolar NPN transistor is electrically coupled to the collector terminal of the fifth NPN bipolar, and the emitter terminal of the third bipolar NPN transistor is electrically coupled to ground through the fifth resistive component.

16. The circuit for amplifying an RF signal received in a mobile device of claim 15, said bias circuit further comprising a third voltage reference circuit for clamping a first terminal of third voltage reference circuit at a third reference voltage, wherein the first terminal of the third voltage reference circuit is electrically coupled to the first terminal of the second voltage reference circuit transistor through a sixth resistive component, and a second terminal of the third voltage reference circuit is electrically coupled to ground, wherein said third voltage reference circuit comprises a sixth bipolar NPN transistor and a seventh bipolar NPN transistor and a resistor, wherein the base terminal of the sixth bipolar NPN transistor is electrically coupled to the collector terminal of the sixth NPN bipolar, the base terminal of the seventh bipolar NPN transistor is electrically coupled to the collector terminal of the seventh NPN bipolar, wherein the emitter terminal of the sixth bipolar NPN transistor is electrically coupled to the collector terminal of the seventh NPN bipolar, and the emitter terminal of the fifth bipolar NPN transistor is electrically coupled to ground through a sixth resistive component.

17. A bias circuit for supplying a bias current to an RF power amplifier, said bias circuit comprising:
- a first bipolar transistor having a base terminal, a collector terminal and an emitter terminal, wherein the emitter terminal is electrically coupled to the RF power amplifier;
- a first voltage reference circuit for clamping a first terminal of first voltage reference circuit at a first reference voltage, wherein the first terminal of the first voltage reference circuit is electrically coupled to base terminal of the first bipolar transistor through a first resistive component, and a second terminal of the first voltage reference circuit is electrically coupled to a ground;
- a second voltage reference circuit for clamping a first terminal of second voltage reference circuit at a second reference voltage, wherein the first terminal of the second voltage reference circuit is electrically coupled to the first terminal of the first voltage reference circuit transistor through a second resistive component, and a second terminal of the second voltage reference circuit is electrically coupled to the ground; and
- a third voltage reference circuit for clamping a first terminal of third voltage reference circuit at a third reference voltage, wherein the first terminal of the third voltage reference circuit is electrically coupled to the first terminal of the second voltage reference circuit transistor through a third resistive component, and a second terminal of the third voltage reference circuit is electrically coupled to the ground;
- wherein a first terminal of the third voltage reference circuit is electrically coupled to a voltage supply through a fourth resistive component so as to generate a bias current to the RF power amplifier through the emitter terminal of the first bipolar transistor.

18. A bias circuit for supplying a bias current to an RF power amplifier, said bias circuit comprising:
- a first bipolar NPN transistor having a base terminal, a collector terminal and an emitter terminal, wherein the emitter terminal is electrically coupled to the RF power amplifier;
- a first voltage reference circuit for clamping a first terminal of first voltage reference circuit at a first reference voltage, wherein the first terminal of the first voltage reference circuit is electrically coupled to base terminal of the first bipolar NPN transistor through a first resistive component, and a second terminal of the first voltage reference circuit is electrically coupled to a ground; and
- a second voltage reference circuit for clamping a first terminal of second voltage reference circuit at a second reference voltage, wherein the first terminal of the second voltage reference circuit is electrically coupled to the first terminal of the first voltage reference circuit transistor through a second resistive component, and a second terminal of the second voltage reference circuit is electrically coupled to the ground;
- wherein a first terminal of the second voltage reference circuit is electrically coupled to a voltage supply through a third resistive component so as to generate a bias current to the RF power amplifier through the emitter terminal of the first bipolar NPN transistor, wherein the first voltage reference circuit comprises a second bipolar NPN transistor and a third bipolar NPN transistor and a fourth resistive component, wherein the base terminal of the second bipolar NPN transistor is electrically coupled to the collector terminal of the second NPN bipolar, the base terminal of the third bipolar NPN transistor is electrically coupled to the collector terminal of the third bipolar NPN transistor, wherein the emitter terminal of the second bipolar NPN transistor is electrically coupled to the collector terminal of the third bipolar NPN transistor, and the emitter terminal of the third bipolar NPN transistor is electrically coupled to ground through the fourth resistive component.

19. The bias circuit for supplying a bias current to an RF power amplifier of claim 18, wherein said second voltage reference circuit comprises a fourth bipolar NPN transistor and a fifth bipolar NPN transistor and a sixth resistive component, wherein the base terminal of the fourth bipolar NPN transistor is electrically coupled to the collector terminal of the fourth NPN bipolar, the base terminal of the fifth bipolar NPN transistor is electrically coupled to the collector terminal of the fifth bipolar NPN transistor, wherein the emitter terminal of the fourth bipolar NPN transistor is electrically coupled to the collector terminal of the fifth bipolar NPN transistor, and the emitter terminal of the fifth bipolar NPN transistor is electrically coupled to ground through the fifth resistive component.

20. The bias circuit for supplying a bias current to an RF power amplifier of claim 19, said bias circuit further comprising a third voltage reference circuit for clamping a first terminal of third voltage reference circuit at a third reference voltage, wherein the first terminal of the third voltage reference circuit is electrically coupled to first terminal of the second voltage reference circuit transistor through a seventh resistive component, wherein said third voltage reference circuit comprises a sixth bipolar NPN transistor and a seventh bipolar NPN transistor and a resistor, wherein the base terminal of the sixth bipolar NPN transistor is electrically coupled to the collector terminal of the sixth bipolar NPN transistor, the base terminal of the seventh bipolar NPN transistor is electrically coupled to the collector terminal of the seventh bipolar NPN transistor, wherein the emitter terminal of the sixth bipolar NPN transistor is electrically coupled to the collector terminal of the seventh bipolar NPN transistor, and the emitter terminal of the seventh bipolar NPN transistor is electrically coupled to the ground through an eighth resistive component.

* * * * *